United States Patent [19]

Fiori, Jr.

[11] Patent Number: 5,694,081
[45] Date of Patent: *Dec. 2, 1997

[54] SIGNAL CONDITIONING APPARATUS

[76] Inventor: David Fiori, Jr., 140 Dolington Rd., Yardley, Pa. 19067

[*] Notice: The term of this patent shall not extend beyond the expiration date of Pat. No. 5,436,593.

[21] Appl. No.: 448,383

[22] PCT Filed: Apr. 28, 1995

[86] PCT No.: PCT/US95/05293
§ 371 Date: Jun. 7, 1995
§ 102(e) Date: Jun. 7, 1995

[87] PCT Pub. No.: WO95/30273
PCT Pub. Date: Nov. 9, 1995

Related U.S. Application Data

[63] Continuation-in-part of Ser. No. 234,343, Apr. 28, 1994, Pat. No. 5,436,593, which is a continuation-in-part of Ser. No. 879,941, May 8, 1992, Pat. No. 5,386,148.

[51] Int. Cl.$^6$ ........................................... H03F 3/45
[52] U.S. Cl. .................................. 330/69; 330/126
[58] Field of Search ......................... 330/69, 124 R, 330/126, 107; 381/99, 100, 120, 121

[56] References Cited

U.S. PATENT DOCUMENTS

| | | | |
|---|---|---|---|
| 3,394,269 | 7/1968 | Miner | 307/229 |
| 4,301,420 | 11/1981 | Sugawara | 330/126 |
| 4,571,554 | 2/1986 | Martin et al. | 330/252 |
| 4,583,245 | 4/1986 | Gelow et al. | 381/100 X |
| 4,621,200 | 11/1986 | Lovrenich | 307/149 |
| 4,679,002 | 7/1987 | Sherwin et al. | 330/69 X |
| 4,922,536 | 5/1990 | Hoque | 381/2 |
| 5,146,506 | 9/1992 | Sasaki | 381/94 |
| 5,170,081 | 12/1992 | Adachi et al. | 307/520 |
| 5,436,593 | 7/1995 | Fiori | 330/69 |

OTHER PUBLICATIONS

"Grounding and Shielding Techniques", Ralph Morrison, 3rd Edition, 1986, pp. 69–71 no month.

Primary Examiner—Steven Mottola
Attorney, Agent, or Firm—Dilworth & Barrese

[57] ABSTRACT

A signal conditioning system that receives inputs from at least one pair of conductors connected to its input. Each such input is processed by an input filter and presented to a buffer amplifier. Each such input filter and buffer amplifier refers to and is powered by independent power sources whose power return reference potentials are independently determined by the potential of the corresponding input signal potential reference conductor for the signal frequencies of interest. The outputs of all such buffer amplifiers, the power return reference potentials, and the power return reference potential of the conditioning circuit output are all appropriately added or subtracted in the next circuit stage. This circuit stage consists of an amplifier buffer having low output impedance which is powered by another independent power source whose power return reference potential is independently determined by the potential of the output signal reference conductor. The output of this circuit stage is connected to an output inductor circuit which in turn drives the output signal conductor. The output includes a filter, and is designed to decouple unstable loading conditions while rejecting external influences on the output signal. The invention also includes means that connect the reference potential of the destination of the output conductors to the system power ground potential. The present invention provides a relatively inexpensive and efficient way of reducing or eliminating interference caused by coax cabling in audio, power and video amplifiers, for example.

35 Claims, 4 Drawing Sheets

SIGNAL CONDITIONING APPARATUS

CROSS REFERENCE TO RELATED APPLICATIONS

This application is a 371 of PCT/US95/05293 filed Apr. 28, 1995 and a continuation-in-part of application Ser. No. 08/234,343 filed Apr. 28, 1994, now U.S. Pat. No. 5,436,593, which is a continuation-in-part of application Ser. No. 07/879,941, filed May 8, 1992, now U.S. Pat. No. 5,386,148.

BACKGROUND OF THE INVENTION

1. Field of the Invention

The present invention relates to circuits that use signal conditioning circuitry to eliminate interferences caused by magnetic fields, electric fields, and electro-magnetic or radio frequency fields on conductors that provide electrical connection between devices in a system. The present invention also relates to various electronic circuit that drive conductors, the electronic circuits including signal conditioning circuit to overcome the adverse effects of their loading on the signal source. More specifically, the present invention relates to audio amplifiers, power amplifiers, video amplifiers, etc. that use signal conditioning circuitry for achieving the above-noted benefit.

2. Description of Related Art

Conductors that provide electrical connection between devices in a system are often the source of many types of electrical interference. Magnetic fields, electric fields and electro-magnetic or radio frequency fields are known to interfere with the fidelity of signals conveyed over conductors which are subjected to those fields. Furthermore, the ground or reference conductor of a typical signal carrying pair of conductors are often connected to different local ground potentials between one end of the conductor as compared to the other, and currents are known to flow in such conductors which then produce voltage drops on that conductor which also interfere with the fidelity of the signals being conveyed. In addition, these conductors, especially when very long, present loads to the signal source that may adversely effect the fidelity of the signal.

The problems of conveying signals over conductor pairs in various types of electronic circuits including amplifier systems such as audio amplifier systems, power amplifier systems, video amplifier systems, etc. is well known. The conveyance of signals, especially between powered devices, is often plagued by electro-magnetic interference.

One method employed to reduce these interferences modulates the signal so that it can be easily separated from the interference, and then demodulates the signal at the destination. For example, an analog-to-digital converter can be utilized to convey digital impulses over the connecting conductors instead of analog voltage potentials. The destination device in such instances must then convert the signal back to an analog signal potential. Such approaches, while effective, can be very costly, and require extensive circuitry at both the sending and receiving ends of the conductors. Such methods are exemplified by U.S. Pat. No. 4,922,536 to Hogue.

Another common method to reduce these interferences is to convey such signals in a differential manner. A common approach utilizes a three conductor shielded cable where two of the conductors deliver the signal and its arithmetic inverse, and a third conductor, usually a shield, conveys the ground reference potential voltage. The conditioning circuit, usually placed at the destination end of the conductors, forms the difference between the potential of the first signal carrying conductor and the second signal carrying conductor. In theory, both conductors are subject to the same interferences, and the subtraction of the signals as conveyed will eliminate the common mode noises. This approach, while effective in eliminating most interference is nevertheless expensive and difficult to implement. To adapt this approach in the general case of processing signals between subsystems requires active circuitry at the sending end to form the inverse signal, and a separate active circuit at the receiving end to subtract the signals. Multiple conductors are also required to be contained within a single shield, which is more costly than conductors having only one conductor surrounded by a shield. Such methods do not, however, address any interference or other affects of the cables that connect the transmitter and receiver to source and destination respectively. Such methods are exemplified by U.S. Pat. No. 4,979,218 to Strahm, and is described at pages 69–71 of "GROUNDING AND SHIELDING TECHNIQUES IN INSTRUMENTATION", by Ralph Morrison, 3rd Edition, 1986, Wiley-Interscience.

One source of interference in the conveyance of these differential signals between electronic subsystems is referred to as the ground loop. Because it is common for there to be multiple electronic paths between the reference potentials of each subsystem, and since such paths commonly include sources of interference, these alternative paths are often responsible for the interference present in those systems. Such ground loops are generally overcome by eliminating any electrical connection by conductors between the subsystems. "GROUNDING AND SHIELDING TECHNIQUES IN INSTRUMENTATION" by Morrison describes the elimination of the effects of the electrical connections between subsystems that convey their signals by differential means through the use of tandem differential amplifiers powered by electrically isolated power supplies.

The first differential amplifier in the Morrison reference calculates the difference between the signals being conveyed, and the second differential amplifier adds the reference potential of the destination to the result of the first differential amplifier. The result is that the reference potentials of the source of the differential signal may differ from the reference potential of the destination without effecting the expression of the signal at the destination. However, such an approach is not easily adapted to electronic systems consisting of single ended two wire signal conductors. Consequently, this approach suffers from the same limitations as devices that convey signals by differential means. For example, there are no means suggested in Morrison for the elimination or suppression of the magnetic field interference that may be picked up between the two conductors enclosed in the shield, due to differences in the magnetic field voltages induced in those conductors. Moreover, Morrison does not address the pickup of electric field interference or any other cable affects due to the output cable.

The circuits shown in the Morrison reference are also particularly subject to the variation of op-amp characteristics. In particular the output impedance of the opamps used to determine A1 will negatively impact the interference rejection of any common mode voltage differences between source and destination reference potentials as that impedance relates to the difference resistors of gain stage A2. As this circuit characteristic is extremely gain and temperature dependent, such inaccuracies are not easily controlled without increased expense in the design of the output stages of those circuits or without compromises inherent in the utilization of higher impedances than would be appropriate in achieving other performance objectives such as thermal noise and bandwidth which are adversely affected by higher resistor values in this case.

SUMMARY OF THE INVENTION

It is an objective of the present invention to provide various types of electronic circuits including amplifier systems, such as audio, power and video amplifier systems, with circuitry to suppress or eliminate the expression of all types of interference in the wiring conveying analog voltage potential signals from a source to a destination. This is accomplished in the present invention by the unique combination of novel interference rejection circuits that address the sources of interference in these systems in a less costly and more efficient manner than other approaches.

It is another objective of the present invention to remove any effect that the loading of such wiring or the effects of the loading of the destination in these devices may have upon the accuracy of the signal as conveyed by the source of the signal.

It is a further objective of the present invention to accomplish the preceding objectives with a minimum number of precision resistors producing greater effective rejection than the prior art for a given cost.

An additional objective of the present invention is the reduction in sensitivity of the circuit action to the characteristics of the gain circuits and/or operational amplifier circuits employed by the circuit to achieve the various aims herein described.

Another objective of the present invention is to provide an economical means of adjusting gain in these systems without affecting the resulting interference rejection in practical applications.

Yet another objective of the present invention is to afford greater rejection of electric field interference and any electric field affects, such as dielectric absorption, due to output cable physics.

A further objective of the present invention is to effect these objectives without altering the accuracy or fidelity of the signal(s) being conveyed between subsystems.

Another objective of the present invention is to provide a device which accomplishes every objective of the present invention as described forthwith by means of an independent circuit which can easily be inserted into the existing wiring between popular electronic devices such as the above-described amplifier systems, for example, and which can accomplish every objective of the present invention as described forthwith with a minimum amount of time required to install the device in these systems.

It is a further objective of the present invention to provide all of the functions associated with state of the art amplification systems while achieving the above-noted benefits with a minimum amount of additional circuitry and without adding any additional active circuitry in the signal path.

A further objective of the present invention is to provide for the conditioning of single ended or differential signals with the same circuit organization and interconnecting wire cable(s).

A further objective of the present invention is to provide for the conditioning of differential signals, or any number of signals, where each signal is produced with reference to independent potential references which make higher levels of interference rejection possible.

It is also an objective of the present invention to accomplish every objective of the invention as described forthwith while utilizing signal wiring between devices which consists of two conductors arranged concentrically. This type of cabling is known as "COAX" which is a shortening of the term "CO-AXIAL", and which refers to a cable whose circular conductors share the same major axis.

BRIEF DESCRIPTION OF THE DRAWINGS

Referring to the drawing.

DETAILED DESCRIPTION OF THE PREFERRED EMBODIMENTS

Figure 1:
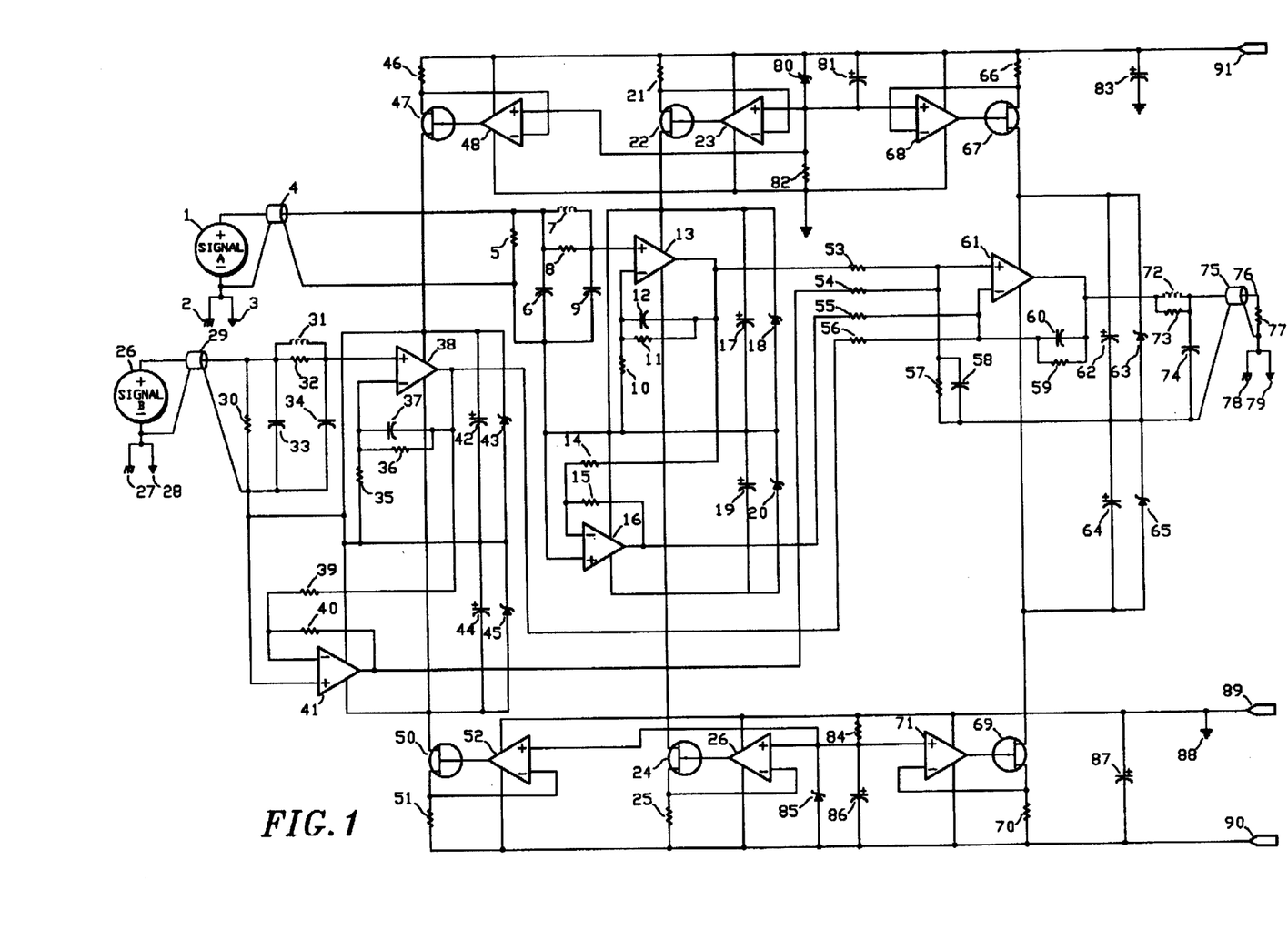
FIG. 1 is a circuit diagram of a preferred embodiment of the signal conditioning circuitry to be included in various types of electronic circuits according to various embodiments of the present invention.

Referring to the drawings, in which like reference numerals identify identical or similar elements, and in particular to FIG. 1, signal source 1 may be understood to be differentially related to signal source 26 in instances where signal 1 and signal 26 are both available and known to relate to each other in an arithmetically inverse manner. Such a relationship is not necessary to carry out the present invention. Other relationships may be appropriate; indeed, if the circuit were to be used as a mixer of signals, there may be no relationship at all. Also, signal 1 or signal 26 need not convey a signal at all, and either may be disconnected to apply the device to single ended signals utilizing only two conductors to convey a signal, without limiting the effectiveness of the device.

Signal 1 and Signal 26 are conveyed over coaxial cable(s) 4 and 29 respectively. Coaxial cables are preferred in connection with this invention because the coaxial nature of the cables offers the special benefit that both conductors respond nearly identically to magnetic field interference by virtue of the high degree of axial symmetry possible around the major axis of the cable run. By virtue of this symmetry, the outer conductor will respond to magnetic fields in substantially the same way as the inner conductor will in accordance with Lenz's law which relates an induced voltage to the rate of change of magnetic field strength. Hence magnetic field disturbances in the vicinity of said cables will induce substantially the same voltage in the outer conductor as such interference will induce in the inner conductor.

The present invention is particularly effective at rejecting the influence of any electric currents conducted by each shield that would tend to shift the reference potential of each signal at its source. This is often a problem because the ground potential impedance of the source is less than ideal in practice. Since each signal is generated with respect to its own reference potential more exactly than with respect to any shared reference potential, and since all such current will only substantially flow into that source reference impedance, affecting both the signal source ground potential and signal potential substantially equally, the present invention will be very effective in eliminating interference so induced. The extreme high impedances of the power supply circuit in the preferred embodiment provides for this principle in a novel and especially effective way at a much lower cost than other techniques.

This power supply circuit is developed in the preferred embodiment by very high impedance current source circuits composed of field effect transistors 47, 22, 50 and 24 in combination with current programming resistors 46, 21, 51 and 25 and opamps 48, 23, 52 and 26. The opamps provide the biasing necessary for the transistors to conduct exactly that current required to produce that voltage across the resistors that match the biasing voltages produced by zener diodes 80 and 85 in combination with resistors 82 and 84. Capacitors 81 and 86 are included to further reject any interference which may be present on the power supply as provided by contacts 91, 89 and 90. In this way an exact current is precisely metered through each transistor to operate opamps 13, 16, 38, and 41. Because this current is metered so precisely, any changes in potential at the opamp supply pins will have no bearing on the current delivered. As a result, the effective impedance of the power supply will be extremely high. The quality of this high impedance current source is limited only by the gate-to-drain capacitance of the field effect transistors used, which can be very small depending on the device characteristics. Field effect transistors with capacitances on the order of 0.05 pf are known to exist in metal gate transistors designed for VHF mixers. Such transistors would easily provide 3 megs of equivalent isolation at 1 Mega-Hz provided opamps 13, 16, 38 and 41 could handle that frequency accurately.

Other transistors could be used as well. While field effect transistors are preferred, ordinary PNP and NPN transistors have proven to work satisfactorily, but available device characteristics are not as ideal as field effect transistors for this purpose. General purpose small signal transistors are limited in isolation by the offset of the base current which varies with collector voltage, and by larger base to collector capacitances, two effects which compromise the performance of this circuit. Careful selection of high B types or darlington configurations can go a long way towards improving such circuits.

Each signal from source 1 or 26 is then subjected to resistor 5 and 30 respectively. This resistance is provided primarily as a path for the input bias current necessary for the operation of operational amplifiers 13 and 38. Such resistors are not, however, required to carry out the present invention, yet are preferred to enable the device to carry out the present invention in every possible context. For example, a common context for the device involves an input signal source that is blocked with a coupling capacitor which would not permit the necessary bias current to flow in the steady state without resistor 5 and 30. These resistors should be designed with the highest resistance value practical considering the effect of the resistor on the source electronics and cable characteristics engendered in sources 1 and 26 and cable 4 and 29.

Capacitors 6, 9, 33 and 34 along with resistors 8 and 32 and inductors 7 and 31 are all part of a Pi-filter arrangement designed to reject frequencies far higher than the frequencies of interest in the signal. Such a filter is preferred to prevent such high frequency interference from interacting with various non-linear elements in typical operational amplifiers, such as are indicated as 13 and 16 in the drawings, and so prevent the demodulating or converting of such high frequency interference to frequencies that would otherwise interfere with the frequencies of interest.

Opamps 13 and 38 along with resistors 10, 11, 35 and 36 form buffer amplifiers which may be designed to include gain according to the ratio of the values of resistors 11 and 36 with respect to resistors 10 and 35. Because the gain of these amplifiers may be important in instances where differential signals are conditioned, these gains should be well matched. However, in the case of a single input, or multiple unrelated inputs, the precision of the gain of this stage will not be important because each input and each amplifier corresponding to each input refers to its own ground reference potential separately. In order to refer to each ground reference potential separately, such as local ground potentials as indicated as 3 and 28, each such buffer opamp 13 and 38 must be powered by separate and independent sources of power whose ground return potentials can assume any value. Signal ground reference potentials 3 and 28 may present by way of the ground conductors of cable 4 and 29. In this way the opamp circuit can not inject any currents into the signal carrying conductor, which would otherwise be possible through various stray capacitances and internal opamp circuits if the opamp's power supplies did not track the reference ground potential of each input. Such injected currents could produce severe feedback instabilities in addition to permitting the expression of any noises that may be included with those injected currents.

Each such opamp 13 and 38 provides, at its output, a signal proportional to the signal provided at its input, but it provides that signal potential with a much lower output impedance. Hence, components may then be connected to the output of the opamps, such as resistors 53 and 56, which inject interference currents into the output of these amplifiers that are directly related to the interference potential between the respective source signal grounds 3 and 28 and the output signal ground 79. The expression of these currents is suppressed, to a large degree, by the ratio of output impedance of the amplifier(s) 13 and 38 and the impedance of resistors 53 and 56 respectively. In the preferred embodiment configured for balanced signal sources as shown in FIG. 1, such interference due to said opamps is additionally cancelled by the differential action of the circuit comprising opamp 61, and resistors 53, 56, 59 and 57. In this way rejection of the common mode interference is limited primarily by the precision of the resistors 53 and 56 viz-a-viz resistors 57 and 59. This result makes it possible to utilize smaller values for these resistors and hence makes wider bandwidth and lower noise levels possible.

Additional rejection of such opamp characteristics is offered by the incorporation of opamps 16 and 41, which are especially beneficial when the signal source is single ended and comprises only signal 1. In this case, the circuit comprised of opamp 16, resistor 14 and resistor 15 may be altered in design by connecting resistor 39 to the positive input of opamp 38 instead of the connection shown, and by matching the ratio of resistors 36 and 35 with the ratio of resistors 40 and 39 so connected. Such an arrangement will produce the same common mode injected errors in opamp 16 as are produced by opamp 13, and these errors will then be subtracted by the differential action of the circuit of opamp 61 in combination with resistors 53 and 55. This improvement could also be applied to the balanced input source case by applying the aforementioned modifications to the input circuit for the complementary source.

Each signal presented at the output of opamps 13 and 38 is then appropriately summed along with inverted signals produced by opamps 16 and 41. These signals and their individual complements hence produce twice the voltage level possible between their outputs than the single opamp 13 or 38 could provide. In addition, this complementary output is presented symmetrically with reference to the source ground potential as is related by the respective cable shield 4 or 29, thus permitting the cancellation of the common mode interference included in that reference potential as compared to the destination reference potential. This arrangement makes it possible to design the following differential gain stage with opamp 61 and resistors 53–57 and 59 with ½ the gain that would otherwise be necessary, and this fact also reduces the sensitivity of the resultant output to that common mode interference. When all component sensitivities are taken into account, a worst case improvement of 4 db in said common mode rejection ratio can be expected without increasing the precision of the resistors required by said differential gain stage.

In any event, the signal from opamps 13, 38, 41 and 16 are summed by the following difference amplifier stage as follows: The signal from opamp 13 is applied to opamp 61 by way of resistor 53 to provide for the expression of that potential minus the inverted version of that potential expressed with reference to the input signal reference potential as presented by the shield conductor of cable 4 by way of resistor 55. Likewise, resistor 54 provides for the expression of its respective signal potential minus the inverted version of that potential expressed about the input signal reference potential ground 28 as presented by the shield conductor of cable 29 by way of resistor 54. Furthermore, resistor 57 provides for the addition of the output reference ground 79 as presented by the shield conductor of cable 75 to the signal output of opamp 61. In this way the output potential of opamp 61 may present a potential at its output that not only calculates the differences between the input potentials and their ground reference returns, but also adds in the output reference potential so that the signal then tracks the reference potential used by the destination receiving the output of opamp 61. These relationships expressed mathematically are as follows:

Where

Vout=Output of opamp 61

Vog=Output ground reference potential as presented by the shield of cable 75

Vin1+=Input from source 1 as presented by cable 4

Vin1g=Input ground reference potential from ground 3 as presented by cable 4

G1=gain of opamp 13=(R10+R11)/R10

VG1+=Output of opamp 13=G1xVin1++Vin1g

VG1-=Output of opamp 16=-G1xVin1++Vin1g

Vin2+=Input from source 26 as presented by cable 29

Vin2g=Input ground reference potential from ground 28 as presented by cable 29

G2=gain of opamp 38=(R35+R36)/R35

VG2+=Output of opamp 38=G2xVin2++Vin2g

VG2-=Output of opamp 41=-G2xVin2++Vin2g

G3=gain of differential amplifier stage with opamp 61 =R60/R55=R60/R56=R57/R53=R57/R54

Vog=output ground potential as presented by the shield of cable 75

Vout=output of opamp 61=VG1+−VG1−−VG2++VG2−+ Vog.

Then the preferred embodiment of the present invention provides for the following relationship:

Signal Output=Vout−Vog=G3x(2xG1xVin1+)−G3x (2xG2xVin2+)=2xG3x((G1xVin+)−(G2xVin2+))

if G1=G2, which is normally the case:

Signal Output=2xG3xG1x(Vin1+−Vin2+)

In order to properly track the output reference potential, while also driving the signal with respect to that reference potential, it is also necessary to supply opamp 61 with power whose reference return potential will accurately assume the same value as the output reference ground 79 as presented by cable 75. This is done in this embodiment by providing opamp 61 with its own separate and independent source of power whose reference ground potential can freely assume any value. Transistors 67 and 69 provide for such power by implementing very high impedance current sources in the same manner as described previously in connection with opamps 13 and 41.

The output of opamp 61 is also filtered, according to the present invention to prevent the interaction of high frequencies picked up in the output cable from being detected by the non-linearities of the opamp at those high frequencies. Also, the inductor 72 and resistor 73 serve to provide a finite, but higher impedance to the opamp at higher frequencies than the capacitor 74 and the capacitance of the cable 75 would present at high frequencies, and which would otherwise render opamp 61 unstable in the servo action of its gain controlling feedback. Also, inductor 72 provides for very low impedance at lower frequencies so that the output cable 75 can be driven with extremely low impedance which can be very effective in shunting any currents that may be injected by electric fields along the cable, or by the electronic device to which the cable may be connected. In addition, the low output impedance afforded by inductor 72 makes it possible for opamp 61 to more accurately drive any cable capacitance that may be presented by cable 75. This is possible because a higher output impedance, as would be necessary without inductor 72, could result in a low pass RC filter (the R being resistor 73 and the C being the sum of capacitor 74 and the effective capacitance of cable 75) that would have a significant effect on the fidelity of the signal being conveyed. In addition, such low drive impedance also shunts the effects of the dielectric of the cable 75. This dielectric may not be ideal as it may be subject to hysteresis-like effects such as dielectric absorption. Low output impedance will effectively reject such characteristics.

In addition, capacitors 58 and 60 may also be added to minimize the tendency of some opamps to amplify higher frequencies in a manner that is not consistent with feed back resistor values, and which could compromise signal fidelity. Capacitor 60 shunts higher frequencies that may be delivered by resistors 55 and 56 while capacitor 58 increases the feedback applied to opamp 61 while it shunts higher frequencies that may be delivered by resistors 53 and 54 to the output. To minimize the effects of these capacitors in the frequency bands of interest, capacitors 58 and 60 should have values that are inversely proportional to resistors 57 and 59 respectively.

One problem with a signal conditioning apparatus intended to interface between two electronic subsystems is the range of different types of inputs to which the device will be connected. Destination devices can vary from having a ground connection that is ultimately connected to the system ground potential to fully isolated differential connections where there is equal, but finite, and sometimes large impedances between the destination signal ground connection and the system ground. Preferably, the present invention is utilized in a system in which the destination signal ground connection is connected to the system power return potential. Since this is not always the case with all destination devices, however, additional means to guarantee such a connection may be included in the present invention.

There is often the occasion to provide signal conditioning for more than one signal at a time. In such instances arrays of signal conditioning devices may be required, such that each signal may be processed by completely separate signal conditioning apparatus. In such instances the power supplies are independent in their ability to relate to the respective signal ground potentials.

Since the present invention utilizes only six matched resistors to condition a balanced source input, it requires only four matched resistors to condition a single ended source input. Further, because of the addition of an inverted circuit placed judiciously with the input circuit, an almost two fold increase in the effective interference rejection of the device may be accomplished for the same resistor matching. As a result, system cost for a given specification is reduced substantially.

As it is often desirable to adjust the gain of the subject signal conditioning embodiment, this gain may be adjusted without affecting the absolute level of unrejected interference. Hence, the present invention is unique in that common mode forms of interference are rejected with a rejection ratio that is actually proportional to the gain so that the interference residuals of each signal's common mode remains constant in spite of the increased gain. Only common mode interferences between differentially applied signals would be proportional to this gain, but these interferences are typically very small in relation to the normal common mode interferences.

Figure 2:
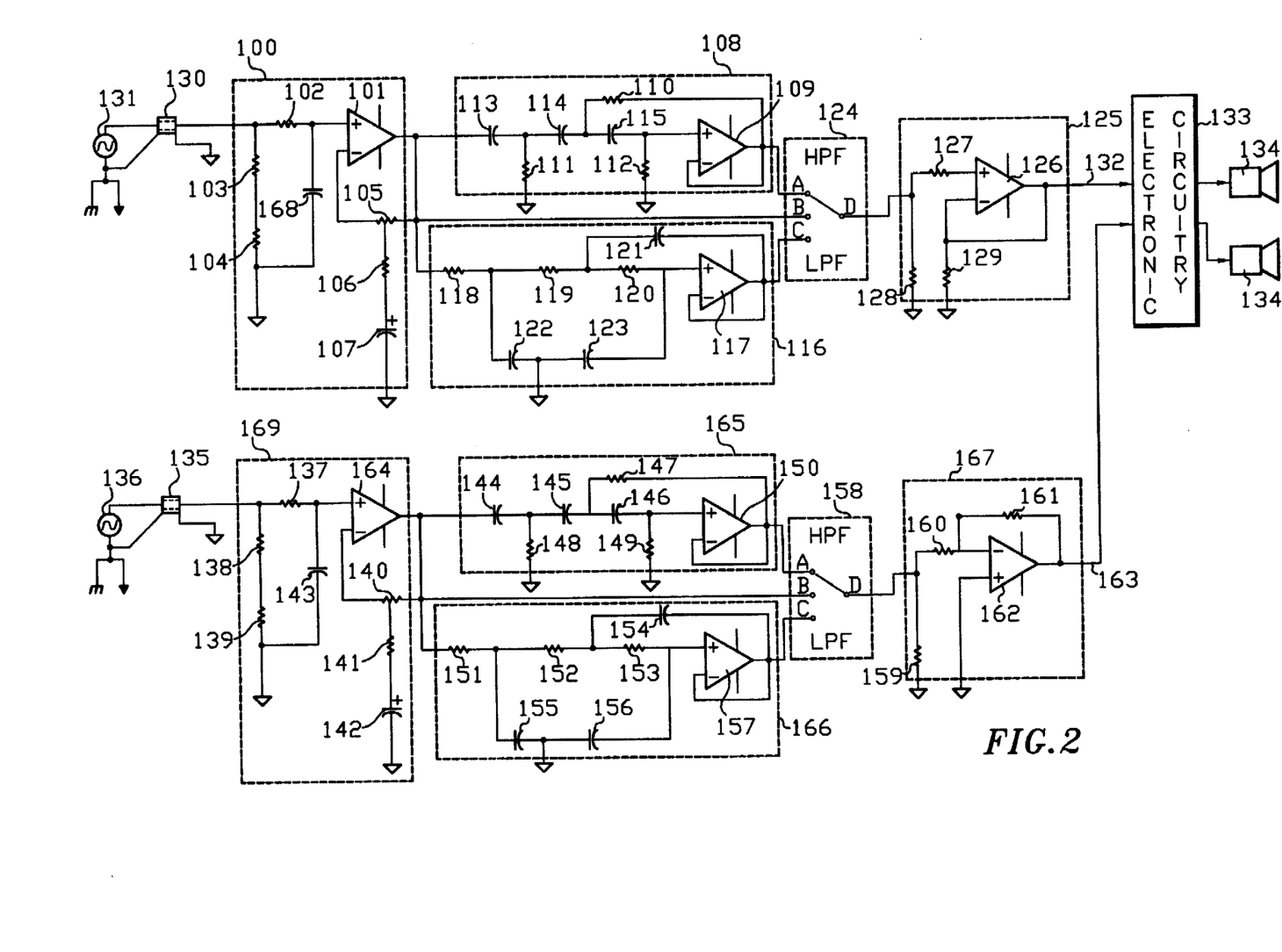
FIG. 2 is a circuit diagram of a typical audio amplifier.

FIG. 2 depicts a front end of a typical audio amplifier. A first channel of the audio amplifier includes a first stage 100 consisting of opamp 101, resistors 102-106 and capacitor 107 forming a non-inverting opamp circuit. A second stage includes a highpass active filter circuit 108 and a low pass active filter circuit 116. Switch 124 is provided for selectively switching the output of highpass filter 108, lowpass filter 116 or the output of first stage 100 directly, to the input of opamp circuit 125 consisting of opamp 126 and resistors 127-129.

The second channel of the audio amplifier is similar to the first channel and includes a first stage 164 consisting of opamp 164, resistors 137-141 and capacitors 142 and 143 also forming a non-inverting opamp circuit. The second stage includes highpass active filter circuit 165 and lowpass active filter circuit 166. Switch 158 selectively switches the output of highpass filter 165, lowpass filter 166 or the output of first stage 164 directly, to the input of inverting opamp circuit 167 consisting of opamp 162 and resistors 159-161. Each of these circuits is well known in the art and each circuit, therefore, will not be described in detail below. These circuits will collectively be referred to hereinafter as the "front end" or preamp of the amplifying system. The output of opamp circuits 125 and 167 can be input to additional electronic circuitry 133 for power amplification, noise reduction, equalization or providing a noise gate function, etc., or any combination thereof. The outputs of processing circuitry 133 can then be input to speakers 134.

According to this embodiment of the present invention, signal source 131 and 136 can consist of any desired source of audio signals, such as a tuner, tape player, compact disc player, etc. When operating in stereo, signal source 131 can represent a left channel and signal source 136 can represent a right channel of an audio signal, for example. When operating in mono, signal sources 131 and 136 can represent the same signal source. By providing a non-inverted signal on line 132 via opamp circuit 125 and its complement on line 163 via inverting opamp circuit 167, it is possible to achieve twice the output voltage by bridging the outputs of circuitry 133.

First stage opamp circuits 100 and 164 form buffer amplifiers providing at their outputs signals proportional to the signals provided at their inputs, but with a much lower output impedance.

Highpass filter circuits. 108 and 165 block the low frequency signals and DC while passing the high frequency signals. These high frequency signals can be used for driving a high frequency speaker such as a "tweeter", for example. The output of highpass filter circuit 108 is provided to terminal A of switch 124 and the output of highpass filter circuit 165 is provided to terminal A of switch 158.

On the other hand, lowpass filter circuits 116 and 166 block the high frequency signals while passing the low frequency signals. These low frequency signals can be used for driving a low frequency speaker such as a "woofer", for example. The output of lowpass filter circuit 116 is provided to terminal C of switch 124 and the output of lowpass filter circuit 166 is provided to terminal C of switch 158.

Switches 124 and 158 are manual switches used for directing signals from one of terminals A–C to the respective inputs of opamp circuits 125 and 167. Opamp circuit 125 provides a non-inverted signal on output line 132. Inverting opamp circuit 167 provides an inverted signal on output line 163. The signal on output lines 132 and 163 can then be input to additional electronic circuitry 133 for power amplification, noise reduction, etc. The signals output from circuitry 133 can then input to right and left speakers 134, for example, when operating in stereo. When operating in mono, the outputs of circuitry 133 can be bridged and input to a single speaker 134.

The "front end" provides most of the voltage amplification in such an audio amplifier system and electronic circuitry 133 (e.g., a power amplifier) provides most of the current amplification.

Figure 3:
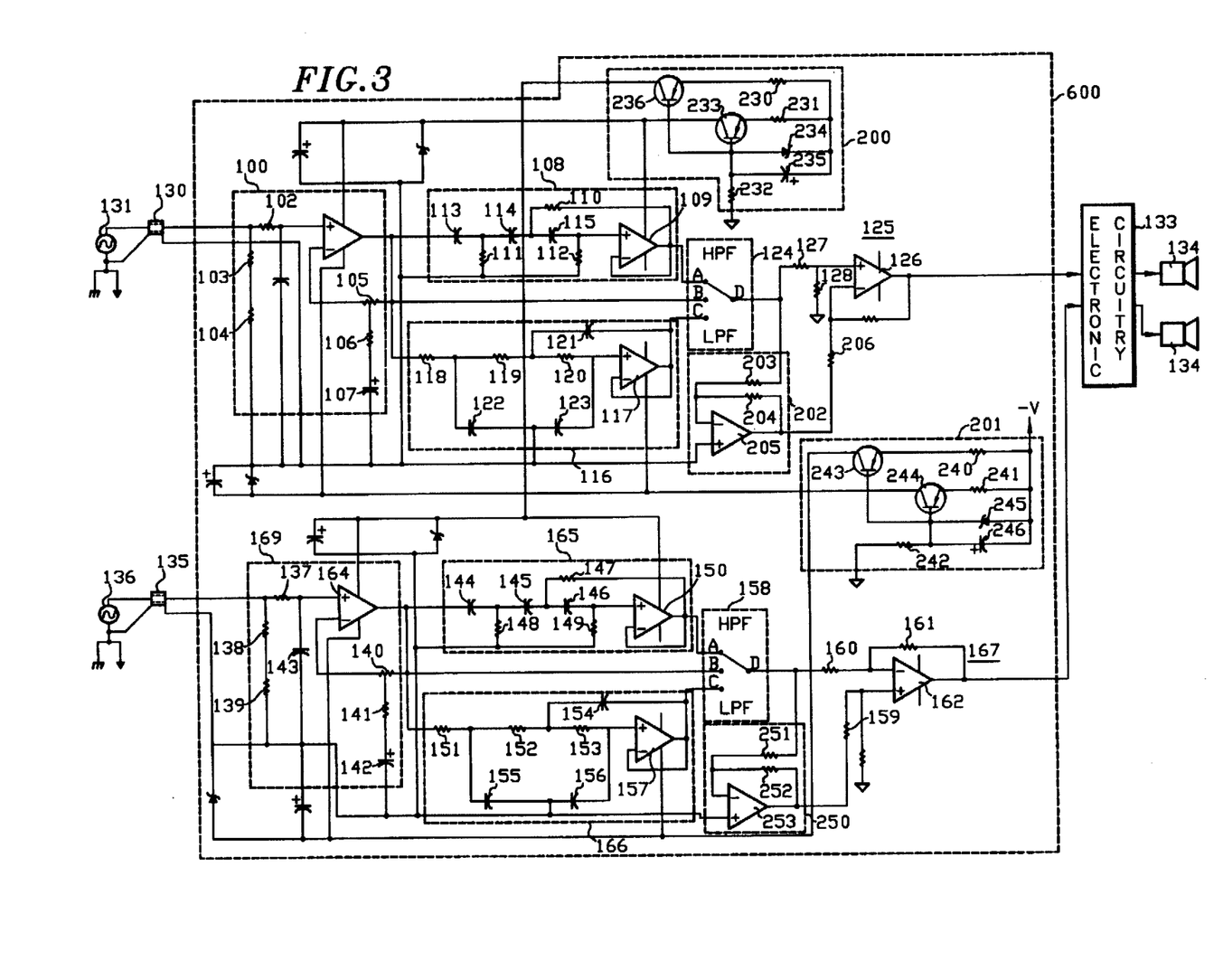
FIG. 3 is a circuit diagram of the typical audio amplifier including signal conditioning circuitry according to an embodiment of the present invention.

Some of the problems typically encountered by the audio amplifier circuitry as described above is that the conductors (e.g., coax cables) tend to introduce interference into the audio signal thus degrading audio quality. As shown in FIG. 3, the present invention provides signal conditioning circuitry, similar to that described above with respect to FIG. 1, that eliminates noise introduced by the coax cables, without compromising signal quality. Such benefits are possible using a very minimum amount of additional circuitry.

FIG. 3 shows the typical audio amplifier depicted in FIG. 2 including signal conditioning circuitry similar to that described above with respect to FIG. 1. Circuit 200, consisting of resistors 230–232, transistors 233 and 236, zener diode 234 and capacitor 235 and circuit 201 consisting of resistors 240–242, transistors 243 and 244, zener diode 245 and capacitor 246 provide high impedance constant current sources for delivering the exact current necessary to operate the operational amplifiers in the circuitry. Constant current source circuits 200 and 201 are illustrative of circuits that can perform this function. Other well known circuitry may also be used for delivering constant current. As shown, the ground lines for each of the elements for each channel are tied together and not to a common ground.

Input amplifier circuits 100 and 164, highpass filters 108 and 165 and lowpass filters 116 and 166 perform the same functions as described above with respect to FIG. 2. The present invention includes inverting opamp circuit 202 consisting of resistors 203 and 204 and opamp 205 and inverting opamp circuit 250 consisting of resistors 251 and 252 and opamp 253. The gain of inverting opamp circuits 202 and 250 can be varied by varying the resistance ratios of resistors 203 and 204 resistors 251 and 252, respectively.

A basic difference in the circuitry between FIG. 2 and FIG. 3 is that the output signals from switches 124 and 158 and the output of opamp circuits 202 and 250 are summed by differential amplifiers 125 and 167, respectively, as follows: The signal from switch 124 is applied to opamp 126 by way of the voltage divider consisting of resistors 127 and 128 to provide for the expression of that potential minus the inverted version of that potential expressed with reference to the input signal reference potential as presented by the shield conductor of cable 130 by way of opamp 205 and resistor 206. The inverted version of the signal from switch 158 is expressed with reference to the input signal reference potential as presented by the shield conductor of cable 135 by way of opamp 253 and resistor 159 to provide for the expression of that potential minus the signal from switch 158 applied to opamp 162 by way of resistor 160. As described above with respect to FIG. 2, the output of opamps 126 and 162 may then be further processed by additional electronic circuitry 134 (e.g., a power amplifier) and output by one or more speakers 134.

The additional electronic circuitry 133 can be provided as a separate and distinct unit from preamp circuitry 600 depicted in FIG. 3. In the alternative, the additional electronic circuitry 133 and the preamp or "front end" circuitry 600 can be provided as a unit in a single case, for example. Using the circuitry as described in FIG. 3, the present invention is capable of eliminating noise introduced caused by the conductors and providing a clean output signal.

In addition to conditioning audio signals in an audio amplifier as described above, the signal conditioning circuitry of the present invention can also be provided in other arrangements. For the description of the following embodiments of the present invention, the signal conditioning circuitry depicted in FIG. 1 (or the "front end" depicted in broken line box 600 in FIG. 3) is shown in block diagram form as block 403.

Figure 4:
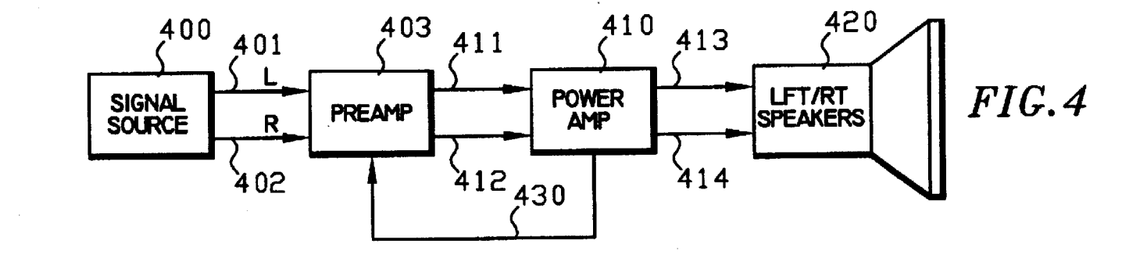
FIG. 4 is a block diagram of an amplifier system according to an embodiment of the present invention.

As shown in FIG. 4, the right and left outputs of signal source 400 can be fed through coax cables 401 and 402, respectively, to the input of preamp 403. As noted above, preamp 403 can consist of the signal conditioning circuitry depicted in FIG. 1, or can consist of the "front end" circuitry 400 as depicted in FIG. 3. Preamp 403 provides voltage amplification and eliminates noise in the signals being processed, without compromising signal quality. The output of preamp 403 can then be provided to the input of power amplifier 410. Power amplifier 410 provides current amplification of the signals on lines 411 and 412 for driving right and left speakers 420 via lines 413 and 414 when operating in stereo, for example. When operating in mono, lines 413 and 414 can be bridged to drive a single speaker.

According to this embodiment of the present invention, preamp 403 can be provided as a separate unit from power amplifier 410, or can be provided as an integral unit with power amp 410. If preamp 403 is provided as a separate unit, instead of providing individual power supplies for power amp 403 and power amp 410, power can be supplied to preamp 403 from power amp 410 via cable 430.

Figure 5:
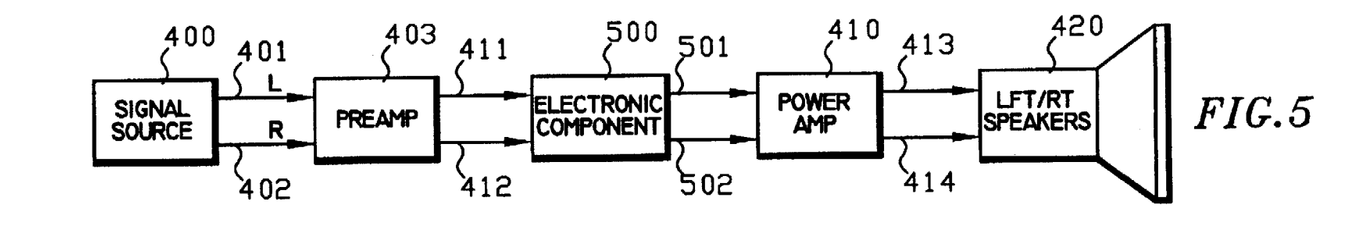
FIG. 5 is a block diagram of another embodiment of the amplifier system according to an embodiment of the present invention.

FIG. 5 is similar to FIG. 4, but includes an additional electronic component 500. Component 500 can consist of an equalizer, crossover, noise reduction or effects processor circuitry, etc. or any combination thereof. The present invention can be used in any state of the art amplification system to eliminate noise without altering the effect of any other type of processing and without compromising sound quality in any way.

It is preferable that the majority of the voltage amplification of the amplifier system of the present invention take place in preamp 403 and that any circuitry that reduces gain be provided after preamp 403. The majority of the current amplification of the amplifier system of the present invention occurs in power amp 410. However, it may also be preferable that speakers 420 include their own current amplification circuits, particularly if speakers 420 consist of bass speakers. In addition, the present invention makes it possible to provide such current amplification without the necessity of isolated power supplies which are costly and lower in performance. In order to achieve the best results, it is preferable that if intermediate processing units are provided between the voltage amplification circuitry and the current amplification circuitry, that the power supplies for driving each of these units be isolated power supplies.

Figure 6:
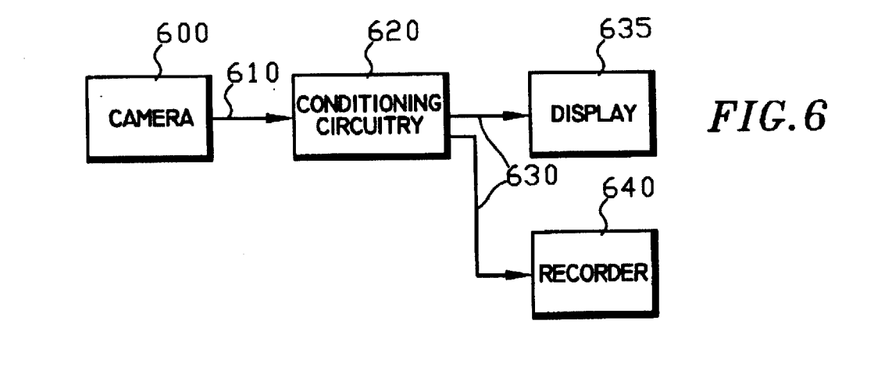
FIG. 6 is a block diagram of a video circuit including signal conditioning circuitry according to an embodiment of the present invention.

The signal conditioning circuitry of the present invention can also be used for conditioning other types of signals besides audio signals. For example, as shown in FIG. 6, the video signals from camera 600 can be fed through coaxial cable 610 to the input of signal conditioning circuit 620. Signal conditioning circuit 620, consisting of the signal conditioning circuitry depicted in FIG. 1, suppresses or eliminates noise or interference introduced by the coaxial cables and provides a relatively clean output signal. The output signal can then be fed via coax 630 to video display 635 for immediate display and/or to remote video recorder 640 for recording. Signal conditioning circuit 620 can be provided as a unit separate from camera 600, display 635 and recorder 640, or can be incorporated into an input or output stage of display 635 and/or recorder 640.

The foregoing has set forth exemplary and preferred embodiments of the present invention. It will be understood, however, that various alternatives will occur to those of ordinary skill in the art without departure from the spirit and scope of the present invention.

What is claimed is:

1. An amplifier circuit comprising:
   a first stage for amplifying at least one applied signal and for generating at least one intermediate signal proportional to a potential difference between the at least one applied signal and at least one return reference signal corresponding to the at least one applied signal;
   a second stage, operatively coupled to the first stage, for frequency filtering the intermediate signal, the second stage generating at least one filtered intermediate signal and an inverted filtered intermediate signal which is proportional to a potential difference between the filtered intermediate signal and the at least one return reference signal corresponding to the at least one applied signal; and
   a third stage for generating an output signal which is a sum of the filtered intermediate signal generated in the second stage minus a potential of the inverted filtered intermediate signal generated in the second stage.

2. An amplifier circuit as recited in claim 1, wherein the first stage comprises a non-inverting amplifier.

3. An amplifier circuit as recited in claim 1, wherein the second stage comprises a highpass filter.

4. An amplifier circuit as recited in claim 1, wherein the second stage comprises a lowpass filter.

5. An amplifier circuit as recited in claim 1, wherein the second stage comprises an inverting opamp circuit for generating the inverted filtered intermediate signal.

6. An amplifier circuit as recited in claim 1, wherein the second stage comprises a lowpass filter for providing a low frequency output and a highpass filter for providing a high frequency output and means for selectively switching therebetween.

7. An amplifier circuit as recited in claim 1, further comprising a constant current source for driving the first and second stage with a constant current.

8. An amplifier circuit as recited in claim 1, further comprising power amplification circuitry for providing current amplification of the output signal from the third stage.

9. An amplifier circuit as recited in claim 1, wherein the at least one applied signal is input from a source by a coaxial cable.

10. An amplifier circuit as recited in claim 1, the first stage comprising an operational amplifier circuit.

11. An amplifier circuit as recited in claim 10, wherein the first stage comprises a non-inverting amplifier.

12. An amplifier circuit as recited in claim 1, the third stage comprising an operational amplifier circuit.

13. An amplifier circuit as recited in claim 1, wherein the second stage comprises a cross-over circuit.

14. A system for amplifying and conditioning signals, the system comprising:
    a first circuit comprising:
    a) an input for receiving at least one input signal;
    b) a first stage for generating at least one intermediate signal which is proportional to a potential difference between the at least one input signal and at least one return reference signal corresponding to the at least one input signal, said first stage further generating at least one inverted signal corresponding to the at least one input signal; and
    c) a second stage, operatively coupled to the first stage, for generating an output signal which is a sum of the at least one intermediate signal generated in the first stage plus an output return reference minus a potential of the inverted signal; and
    a second circuit comprising an amplifier for current amplifying the output signal from the second stage of the first circuit.

15. A system for amplifying and conditioning signals as recited in claim 14, wherein the first circuit and the second circuit are provided in separate and distinct housings.

16. A system for amplifying and conditioning signals as recited in claim 15, wherein the second circuit includes a power supply and supplies power to the first circuit.

17. A system for amplifying and conditioning signals as recited in claim 14, the first stage further comprising frequency filter circuitry for frequency filtering the at least one input signal.

18. A system for amplifying and conditioning signals as recited in claim 17, wherein the frequency filter circuitry comprises a low pass filter.

19. A system for amplifying and conditioning signals as recited in claim 17, wherein the frequency filter circuitry comprises a high pass filter.

20. A system for amplifying and conditioning signals as recited in claim 17, wherein the frequency filter circuitry comprises a low pass filter and a high pass filter and means for selectively switching therebetween.

21. A system for amplifying and conditioning signals as recited in claim 14, wherein the amplifier comprises a power amplifier.

22. A system for amplifying and conditioning signals as recited in claim 14, wherein the first circuit comprises a preamplifier.

23. A system for amplifying and conditioning signals as recited in claim 14, wherein the amplifier circuit comprises an amplifier for amplifying video signals.

24. A system for amplifying and conditioning signals as recited in claim 14, wherein the first circuit and second circuit are provided in the same housing.

25. A system for amplifying and conditioning signals as recited in claim 14, further comprising circuitry for equalizing, noise reducing and effects processing the signal output from the second stage and for providing the output signal to the second circuit.

26. A circuit for amplifying and conditioning audio signals in an audio system, the circuit comprising:
    a) a first stage for generating at least one intermediate audio signal which is proportional to a potential difference between at least one applied audio signal and at least one return reference signal corresponding to the at least one audio signal, said first stage further generating at least one inverted applied audio signal corresponding to the at least one applied audio signal;
    b) a second stage, operatively coupled to the first stage, for generating an output audio signal which is a sum of the at least one intermediate audio signal generated in the first stage plus an output return reference signal minus a potential of the inverted applied audio signal; and
    c) a power amplifier for current amplifying the output audio signal generated in the second stage.

27. A circuit for conditioning video signals in a video system, the circuit comprising:
    a) a first stage for generating at least one intermediate video signal which is proportional to a potential difference between at least one applied video signal and at least one return reference signal corresponding to the at least one applied video signal; said first stage further generating at least one inverted applied video signal corresponding to the at least one applied video signal; and
    b) a second stage, operatively coupled to the first stage, for generating an output video signal which is a sum of said at least one intermediate video signal generated in the first stage plus an output return reference signal minus a potential of the inverted applied video signal.

28. A circuit for conditioning signals in a system, comprising:
    a first stage having a buffer amplifier for receiving at least one input signal and generating therefrom at least one intermediate signal which is proportional to a potential difference between the at least one input signal and at least one return reference signal corresponding to the at least one input signal;
    a power supply circuit coupled to said first stage for providing a constant current with a high impedance to increase electrical isolation between the first stage and the at least one return reference signal; and
    a second stage, operatively coupled to the first stage, for generating an output signal which is a sum of the at least one intermediate signal generated in the first stage minus a potential of the at least one return reference signal plus an output return reference signal.

29. The circuit according to claim 28, further comprising power supply circuitry coupled to said second stage for providing a constant current with a high impedance to increase electrical isolation between the second stage and the output return reference signal.

30. The circuit according to claim 29, wherein a power return reference potential of said power supply circuit coupled to said first stage is independently determined by a potential of said return reference signal corresponding to said input signal.

31. The circuit according to claim 30, wherein a power return potential of said power supply circuitry coupled to said second stage is independently determined by a potential of said output return reference signal.

32. Apparatus for conditioning signals, comprising:
 a) a first circuit part having a first buffer amplifier for receiving a first applied signal and generating therefrom a first intermediate signal proportional to a potential difference between said first applied signal and a first return reference signal corresponding to said first applied signal, and having a first power supply circuit for providing a constant current to said first buffer amplifier with a high impedance, said first power supply circuit having a first power return reference potential independently determined by a potential of said first return reference signal;
 b) a second circuit part having a second buffer amplifier for receiving a second applied signal and generating therefrom a second intermediate signal proportional to a potential difference between said second applied signal and a second return reference signal corresponding to said second applied signal, and having a second power supply circuit for providing a constant current to said second buffer amplifier with a high impedance, said second power supply circuit having a second power return reference potential independently determined by a potential of said second return reference signal;
 c) a third circuit part, operatively coupled to said first circuit part, for generating a first output signal which is a sum of said first intermediate signal plus an output return reference signal minus a potential of said first return reference signal;
 d) a fourth circuit part, operatively coupled to said first circuit part, for generating a second output signal which is a sum of a potential of said second return reference potential plus said output return reference signal minus said second intermediate signal; and
 e) an output circuit for bridging said first and second output signals.

33. The apparatus according to claim 32, wherein said first and second circuit parts further comprise first and second inverters, respectively, for providing respective first and second inverted signals corresponding to said first and second applied signals, respectively, said first and second inverted signals being applied to the third and fourth circuit parts, respectively, to substantially double voltages in the output signals thereof.

34. The apparatus according to claim 32, further comprising a first filter circuit coupled between said first buffer amplifier and said third circuit part, for filtering said first intermediate signal, and a second filter circuit coupled between said second buffer amplifier and said fourth circuit part, for filtering said second intermediate signal.

35. The apparatus according to claim 34 wherein said first and second filter circuits include respective first and second operational amplifiers driven by respective first and second constant current sources each having a high impedance.

* * * * *